United States Patent
Inoue

(10) Patent No.: US 6,841,837 B2
(45) Date of Patent: Jan. 11, 2005

(54) SEMICONDUCTOR DEVICE

(75) Inventor: Yukihiro Inoue, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/768,556

(22) Filed: Jan. 25, 2001

(65) Prior Publication Data

US 2001/0010384 A1 Aug. 2, 2001

(30) Foreign Application Priority Data

Jan. 31, 2000 (JP) .................................... 2000-021256

(51) Int. Cl.[7] .................. H01L 29/76; H01L 29/94; H01L 31/062; H01L 31/113; H01L 31/119
(52) U.S. Cl. .................. 257/409; 257/395; 257/396; 257/397; 257/398; 257/399; 257/400; 438/140; 438/298
(58) Field of Search .................. 257/409, 127, 257/413, 484, 394, 395, 398–400, 349, 359, 509, 519, 396, 397, 347; 438/217, 140, 298

(56) References Cited

U.S. PATENT DOCUMENTS

| | | | | |
|---|---|---|---|---|
| 4,819,045 A | * | 4/1989 | Murakami | 257/371 |
| 4,918,510 A | * | 4/1990 | Pfiester | 257/69 |
| 5,164,806 A | * | 11/1992 | Nagatomo et al. | 257/395 |
| 5,831,310 A | * | 11/1998 | Ohsono | 257/349 |
| 5,915,179 A | * | 6/1999 | Etou et al. | 257/484 |
| 6,306,700 B1 | * | 10/2001 | Yang | 438/217 |

* cited by examiner

Primary Examiner—Eddie Lee
Assistant Examiner—Samuel A Gebremariam
(74) Attorney, Agent, or Firm—Stevens, Davis, Mills & Mosher, LLP

(57) ABSTRACT

A semiconductor device has: a gate insulator film of a transistor formed in a predetermined region on a region of a first conductivity type; a gate electrode of the transistor formed on the gate insulator film; a diffusion layer of a second conductivity type formed on both sides of the gate insulator film on the region of the first conductivity type; and a diffusion layer of the first conductivity type formed on the region of the first conductivity type so as to surround the gate insulator film and the diffusion layer of the second conductivity type. The diffusion layer of the first conductivity type has a higher impurity concentration than the region of the first conductivity type. In such a semiconductor device, the diffusion layer of the first conductivity type is formed so as to be separated from the gate insulator film. Consequently, it is the region of the first conductivity type having a lower concentration than the diffusion layer of the first conductivity type that forms a PN junction with the inversion layer in the channel region formed when the transistor is on (the inversion layer of the second conductivity type below the gate insulator film), so that the energy barrier of the PN junction is higher than that of the conventional PN junction of the diffusion layer of the first conductivity type and the inversion layer of the second conductivity type. As a result, leakage current generation is suppressed.

8 Claims, 10 Drawing Sheets

SEMICONDUCTOR DEVICE

BACKGROUND OF THE INVENTION

1. Field of the Invention

The present invention relates to a semiconductor device such as a high voltage transistor used for a semiconductor integrated circuit.

2. Prior Art

High voltage transistors are mostly used as devices constituting driving circuits (drivers) of liquid crystal displays. In recent years, liquid crystal displays have become higher in resolution, decreased in power consumption and increased in screen size, so that higher withstand voltage and lower power consumption have been required of liquid crystal drivers used therefor. In such liquid crystal display drivers, a CMOSFET for a general circuit and a high voltage MOSFET are both provided on the same semiconductor chip, and the circuit configuration is such that the high voltage MOSFET is used as a peripheral circuit connected to an output terminal for output from the semiconductor chip to the outside and the CMOSFET constituting a low-voltage-operated highly integrated circuit that controls the high voltage MOSFET is formed within the semiconductor chip.

The structure of a high voltage transistor having offset-type source and drain used for such circuits is shown in FIGS. 3A to 3D. FIG. 3A is a perspective plan view of the high voltage transistor which is a conventional semiconductor device. FIG. 3B is a cross-sectional view taken on the line III–III' of FIG. 3A. FIG. 3C is a cross-sectional view taken on the line I–I' of FIG. 3A. FIG. 3D is a cross-sectional view taken on the line II–II' of FIG. 3A.

Referring to FIGS. 3B and 3C, a P-type well 2 is present on the surface of a P-type substrate 1. N-type source and drain diffusion layers 3a and 3b, a P-type guard band diffusion layer 4 and a LOCOS oxide film 5 formed by selective oxidation are present on the surface of the P-type well 2. N-type offset diffusion layers 6a and 6b and a P-type diffusion layer 7 are present below the LOCOS oxide film 5. A polysilicon gate electrode 9 is present so as to cover a gate oxide film 8 and part of the LOCOS oxide film 5. The P-type diffusion layer 7 is necessary as a channel stopper region below the LOCOS oxide film 5 of the high voltage transistor.

Referring to FIG. 3A, the N-type offset diffusion layers 6a and 6b are present around the N-type source and drain diffusion layers 3a and 3b of a high impurity concentration and is absent below the gate oxide film 8. The P-type diffusion layer 7 is present in contact with the N-type offset diffusion layers 6a and 6b. The gate oxide film 8 is formed between the source side N-type offset diffusion layer 6a and the drain side N-type offset diffusion layer 6b, and protruding portions 10 outwardly protruding from between the diffusion layers 6a and 6b are present. The P-type diffusion layer 7 is formed inside the P-type guard band diffusion layer 4, is in contact with the N-type offset diffusion layers 6a and 6b, and is also formed below the protruding portions 10 of the gate oxide film 8. This is apparent from the cross-sectional view of FIG. 3C taken on the line I–I' of FIG. 3A.

The LOCOS oxide film 5 is formed in the region being hatched by broken lines in FIG. 3A, that is, in a region being inside the P-type guard band diffusion layer 4 and excluding the N-type source and drain diffusion layers 3a and 3b and the gate oxide film 8. The conventional high voltage transistor has the structure as described above.

However, the conventional structure has a problem, which will be described below with reference to FIG. 3D. The chain double-dashed line S in FIG. 3D represents the bent part of the line II–II' of FIG. 3A.

In a case where the high voltage transistor is used as the driver of a liquid crystal panel, for example, when the drain is directly connected to an output pad and the output pad is connected to the liquid crystal panel, the high voltage transistor is capacity-loaded, so that the drain is open. At this time, as shown in FIG. 3D, for example, 0 V is applied to the N-type source diffusion layer 3a, +40 V is applied to the gate electrode 9, −40 V is applied to the P-type well 2 and the P-type guard band diffusion layer 4, and the transistor is on. In the case of such a voltage application condition, an N-type inversion layer 11 is formed immediately below the gate oxide film 8 by the gate voltage. The N-type inversion layer 11 and the P-type diffusion layer 7 form a PN junction 12. Since the N-type source diffusion layer 3a, the N-type offset diffusion layer 6a and the N-type inversion layer 11 are electrically connected, the voltage at the N-type inversion layer 11 is approximately 0 V. It is considered that the potential difference of approximately 40V between −40 V applied to the P-type guard band diffusion layer 4 and 0 V applied to the N-type source diffusion layer 3a is thus applied to the PN junction 12 to cause a tunneling phenomenon that electrons pass through the energy barrier of the PN junction 12, there by causing a leakage current. The arrow B in FIG. 3D represents the path of the leakage current. When the leakage current is caused, in a case where the high voltage transistor is mounted on a liquid crystal panel, an excessive current that does not contribute to the operation flows, which leads to an increase in power consumption. While a case of an N-channel transistor has been described, a similar phenomenon occurs in a P-channel transistor.

SUMMARY OF THE INVENTION

An object of the present invention is to provide a semiconductor device capable of suppressing a leakage current when the transistor is on.

A semiconductor device of the present invention comprises: a gate insulator film of a transistor formed in a predetermined region on a region of a first conductivity type; a gate electrode of the transistor formed on the gate insulator film; a diffusion layer of a second conductivity type formed on both sides of the gate insulator film on the region of the first conductivity type; and a diffusion layer of the first conductivity type formed on the region of the first conductivity type so as to surround the gate insulator film and the diffusion layer of the second conductivity type, and having a higher impurity concentration than the region of the first conductivity type. The diffusion layer of the first conductivity type is formed so as to be in contact with regions at both ends, in a direction of a channel width, of a region where the gate insulator film is formed.

According to this structure, since the diffusion layer of the first conductivity type is formed so as to be in contact with the regions at both ends, in the direction of the channel width, of the region where the gate insulator film is formed, the PN junction of the inversion layer in the channel region formed when the transistor is on (the inversion layer of the second conductivity type below the gate insulator film) and the diffusion layer of the first conductivity type is only the part immediately below an end of the gate insulator film, so that the junction area is smaller than that in the conventional example. Consequently, the leakage current caused by the tunneling is smaller than that caused in the conventional structure, so that a highly reliable high voltage transistor in which increase in power consumption is suppressed is realized.

Moreover, a semiconductor device of the present invention comprises: a gate insulator film of a transistor formed in a predetermined region on a region of a first conductivity type; a gate electrode of the transistor formed on the gate insulator film; a diffusion layer of a second conductivity type formed on both sides of the gate insulator film on the region of the first conductivity type; and a diffusion layer of the first conductivity type formed on the region of the first conductivity type so as to surround the gate insulator film and the diffusion layer of the second conductivity type, and having a higher impurity concentration than the region of the first conductivity type. The diffusion layer of the first conductivity type is formed so as to be separated from the gate insulator film.

According to this structure, since the diffusion layer of the first conductivity type is formed so as to be separated from the gate insulator film, it is the region of the first conductivity type having a lower concentration than the diffusion layer of the first conductivity type that forms a PN junction with the inversion layer in the channel region formed when the transistor is on (the inversion layer of the second conductivity type below the gate insulator film), so that the energy barrier of the PN junction is higher than that of the PN junction of the diffusion layer of the first conductivity type and the inversion layer of the second conductivity type. Consequently, leakage current generation is suppressed, so that a highly reliable high voltage transistor in which increase in power consumption is suppressed is realized.

Moreover, in these semiconductor devices of the present invention, the effects are produced particularly in the case of a high voltage transistor in which a voltage of several tens of volts is applied to the gate electrode. Moreover, the diffusion layer of the first conductivity type may be a channel stopper region.

DESCRIPTION OF THE PREFERRED EMBODIMENTS

Figure 1A:
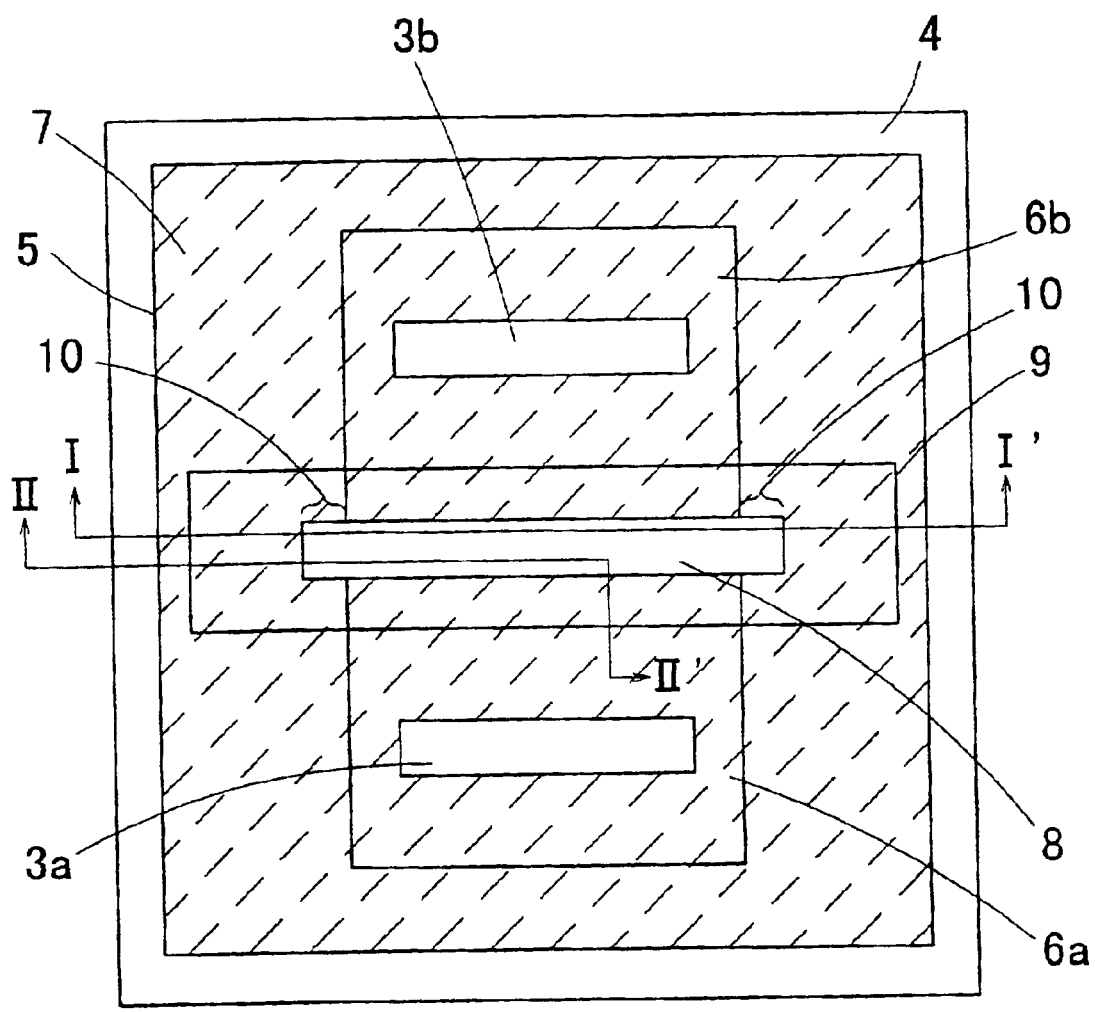
FIG. 1A is a perspective plan view of a semiconductor device according to a first embodiment of the present invention.

Embodiments of the present invention will be described with reference to the drawings. In describing the embodiments, parts having the same functions are designated by the same reference numerals throughout all the drawings.

(First Embodiment)

Figure 1B:
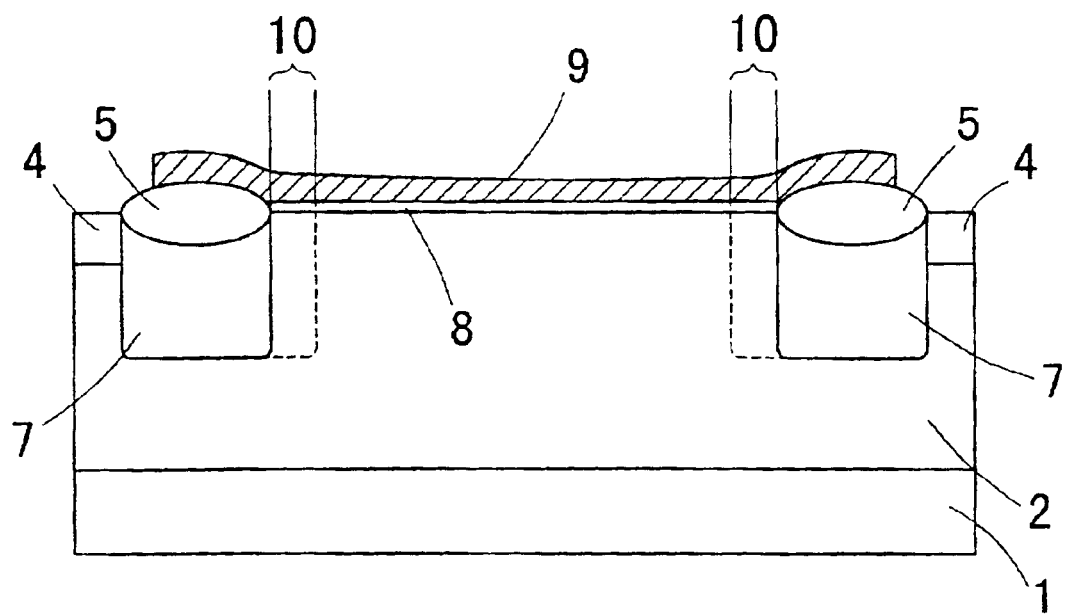
FIG. 1B is a cross-sectional view of the semiconductor device according to the first embodiment of the present invention taken on the line I–I'.
Figure 1C:
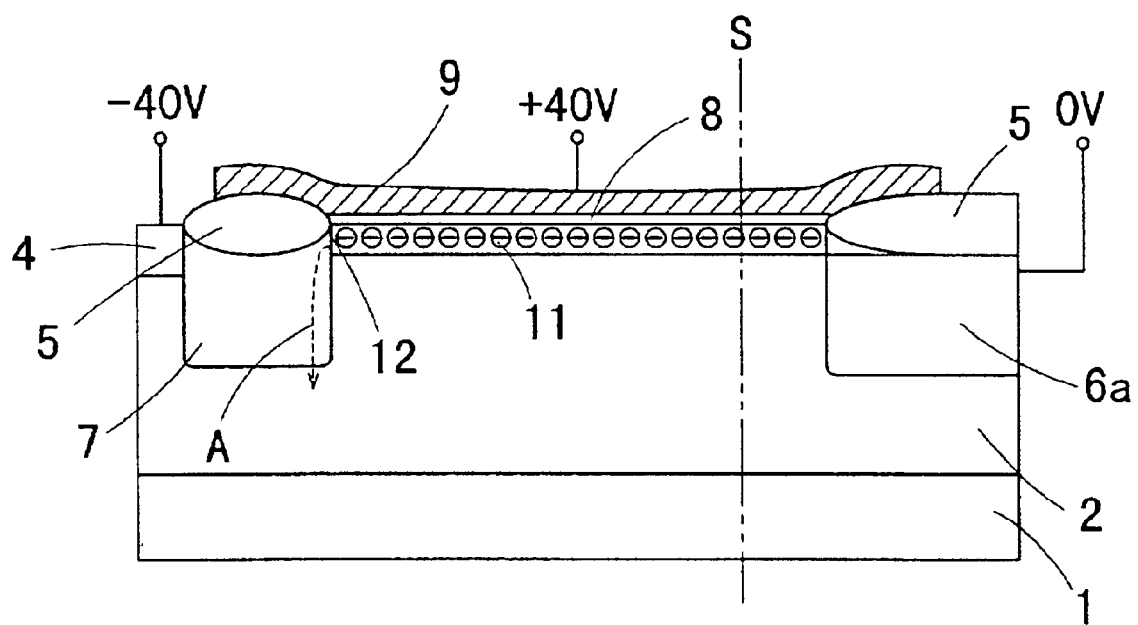
FIG. 1C is a cross-sectional view of the semiconductor device according to the first embodiment of the present invention taken on the line II–II'.

The structure of an N-channel high voltage transistor which is a semiconductor device according to a first embodiment of the present invention is shown in FIGS. 1A to 1C. FIG. 1A is a perspective plan view of the high voltage transistor according to the first embodiment. FIG. 1B is a cross-sectional view taken on the line I–I' of FIG. 1A. FIG. 1C is a cross-sectional view taken on the line II–II' of FIG. 1A. The chain double-dashed line S in FIG. 1C represents the bent part of the line II–II' of FIG. 1A.

A P-type well 2 is present on the surface of a P-type substrate 1. N-type source and drain diffusion layers 3a and 3b, a P-type guard band diffusion layer 4 and a LOCOS oxide film are present on the surface of the P-type well 2. N-type offset source and drain diffusion layers 6a and 6b and a P-type diffusion layer 7 are present below the LOCOS oxide film 5. The P-type diffusion layer 7 is necessary for acting as a channel stopper region below the LOCOS oxide film 5. A polysilicon gate electrode 9 is present so as to cover a gate oxide film 8 and part of the LOCOS oxide film 5.

Viewing two-dimensionally with reference to FIG. 1A, the N-type offset diffusion layers 6a and 6b are present around the N-type source and drain diffusion layers 3a and 3b, for example, in a range of 6 $\mu$m from ends of the diffusion layers 3a and 3b, and is not preset below the gate oxide film 8. The P-type diffusion layer 7 is present in contact with the N-type offset diffusion layers 6a and 6b. The gate oxide film 8 is formed between the source side N-type offset diffusion layer 6a and the drain side N-type offset diffusion layer 6b, and protruding parts 10 outwardly protruding, for example, by 4 $\mu$m from between the diffusion layers 6a and 6b are present. The P-type diffusion layer 7 is formed inside the P-type guard band diffusion layer 4, is in contact with the N-type offset diffusion layers 6a and 6b, and is in contact with the region where the gate oxide film 8 is formed. The P-type diffusion layer 7 is absent below the protruding parts 10 of the gate oxide film 8. Consequently, the P-type diffusion layer 7 is absent below the region where the gate oxide film 8 is formed.

This embodiment has a similar structure to the conventional example shown in FIGS. 3A to 3D except that the region where the P-type diffusion layer 7 is formed is partly different from that of the conventional example, and the LOCOS oxide film 5 is formed in the same region as that of the conventional example.

Explaining the surface concentration and the depth of each diffusion layer with examples, the N-type offset diffusion layers 6a and 6b have a surface concentration of $3.4 \times 10^{16}/cm^3$ and a depth of 1.0 $\mu$m. The P-type diffusion layer 7 has a surface concentration of $4.0 \times 10^{16}/cm^3$ and a depth of 1.2 $\mu$m. The N-type source and drain diffusion layers 3a and 3b have a surface concentration of $1.4 \times 10^{20}/cm^3$. The P-type guard band diffusion layer 4 has a surface concentration of $1.4 \times 10^{20}/cm^3$. The P-type well 2 has a surface concentration of $1.9 \times 10^{15}/cm^3$ and a depth of 16 $\mu$m. The LOCOS oxide film 5 has a thickness of 800 nm. The gate oxide film 8 has a thickness of 160 nm.

In such a transistor structure, like in the conventional example, even when a positive voltage as high as several tens of volts, for example, 40 V is applied to the gate electrode 9, 0 V is applied to the N-type source diffusion layer 3a and an N-type inversion layer 11 the voltage at which is substantially 0 V is formed below the gate oxide film 8 as shown in FIG. 1C, a PN junction 12 formed with the P-type diffusion layer 7 is only the part immediately below an edge of the gate oxide film 8, so that the junction region is small. Consequently, the leakage current caused by the tunneling is smaller than that caused in the conventional structure, so that a highly reliable high voltage transistor in which increase in power consumption is suppressed is realized. The arrow A in FIG. 1C represents the path of the leakage current.

(Second Embodiment)

Figure 2A:
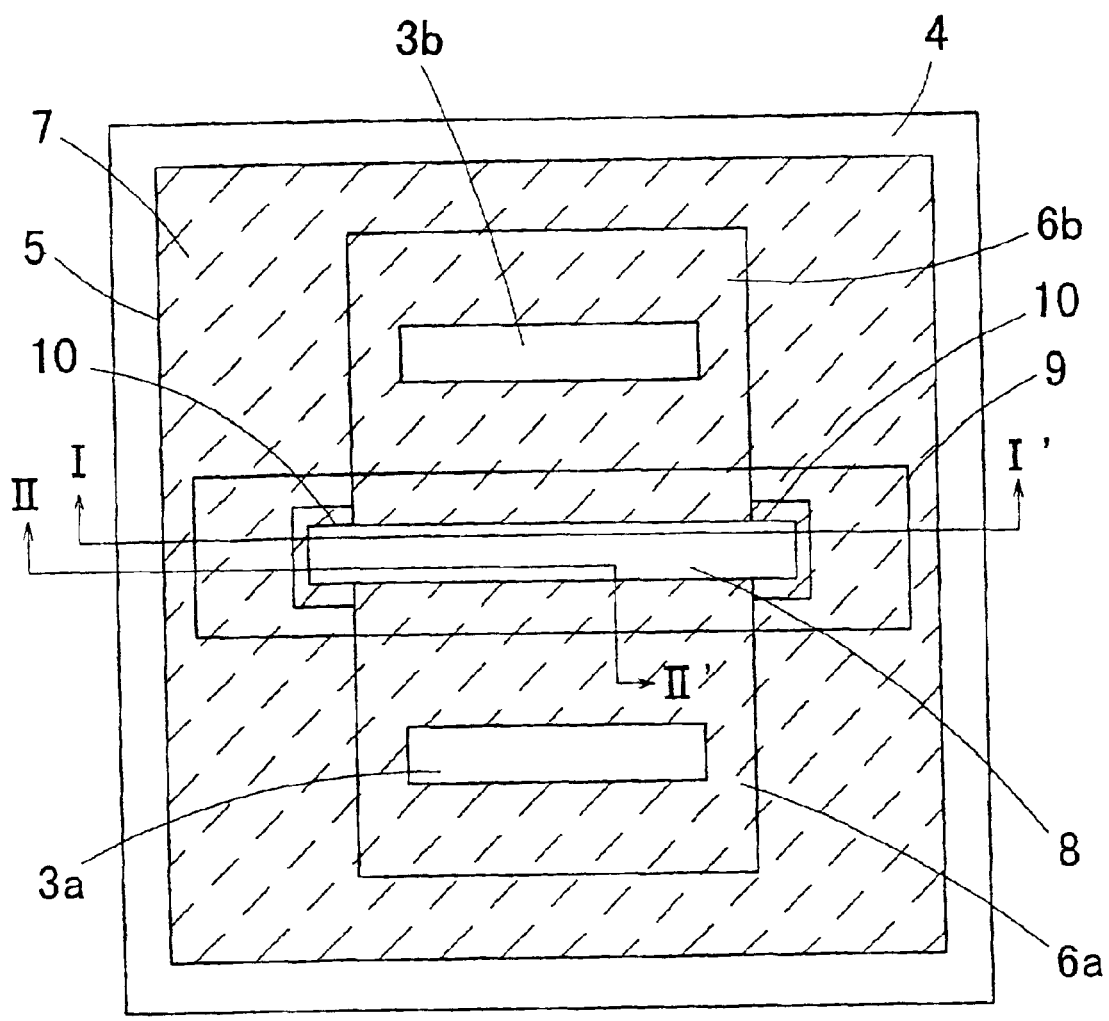
FIG. 2A is a perspective plan view of a semiconductor device according to a second embodiment of the present invention.
Figure 2B:
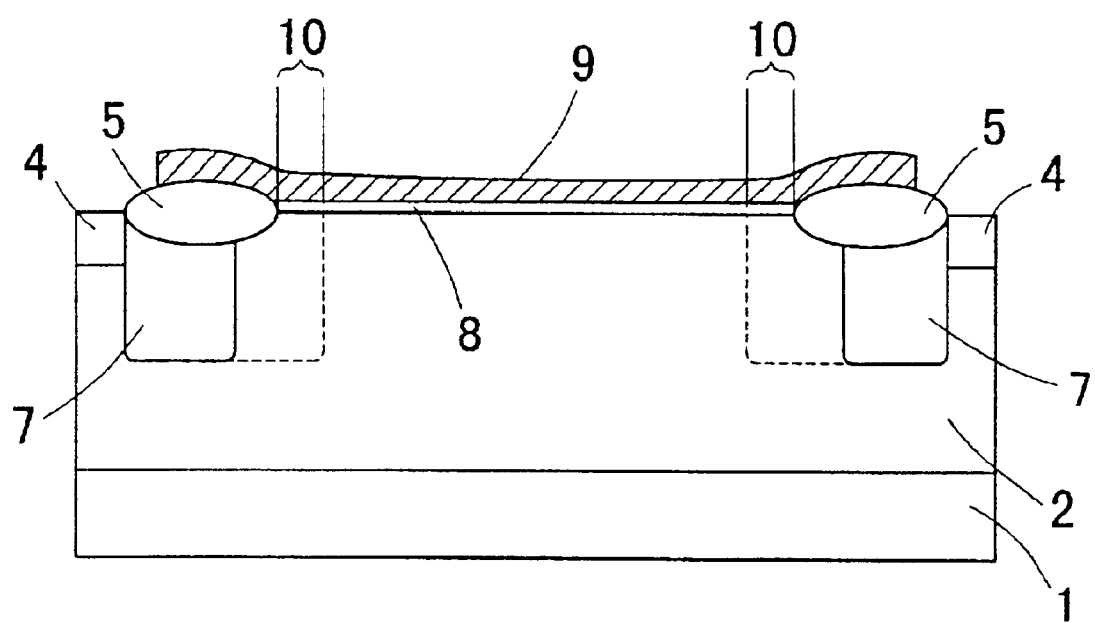
FIG. 2B is a cross-sectional view of the semiconductor device according to the second embodiment of the present invention taken on the line I–I'.
Figure 2C:
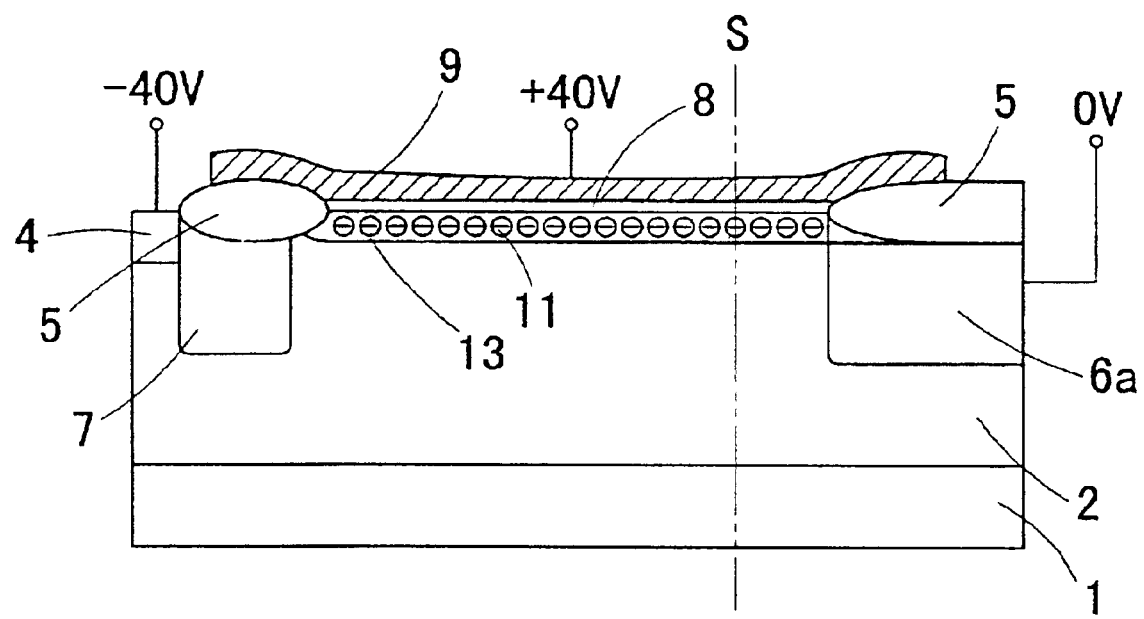
FIG. 2C is a cross-sectional view of the semiconductor device according to the second embodiment of the present invention taken on the line II–II'.
Figure 3A:
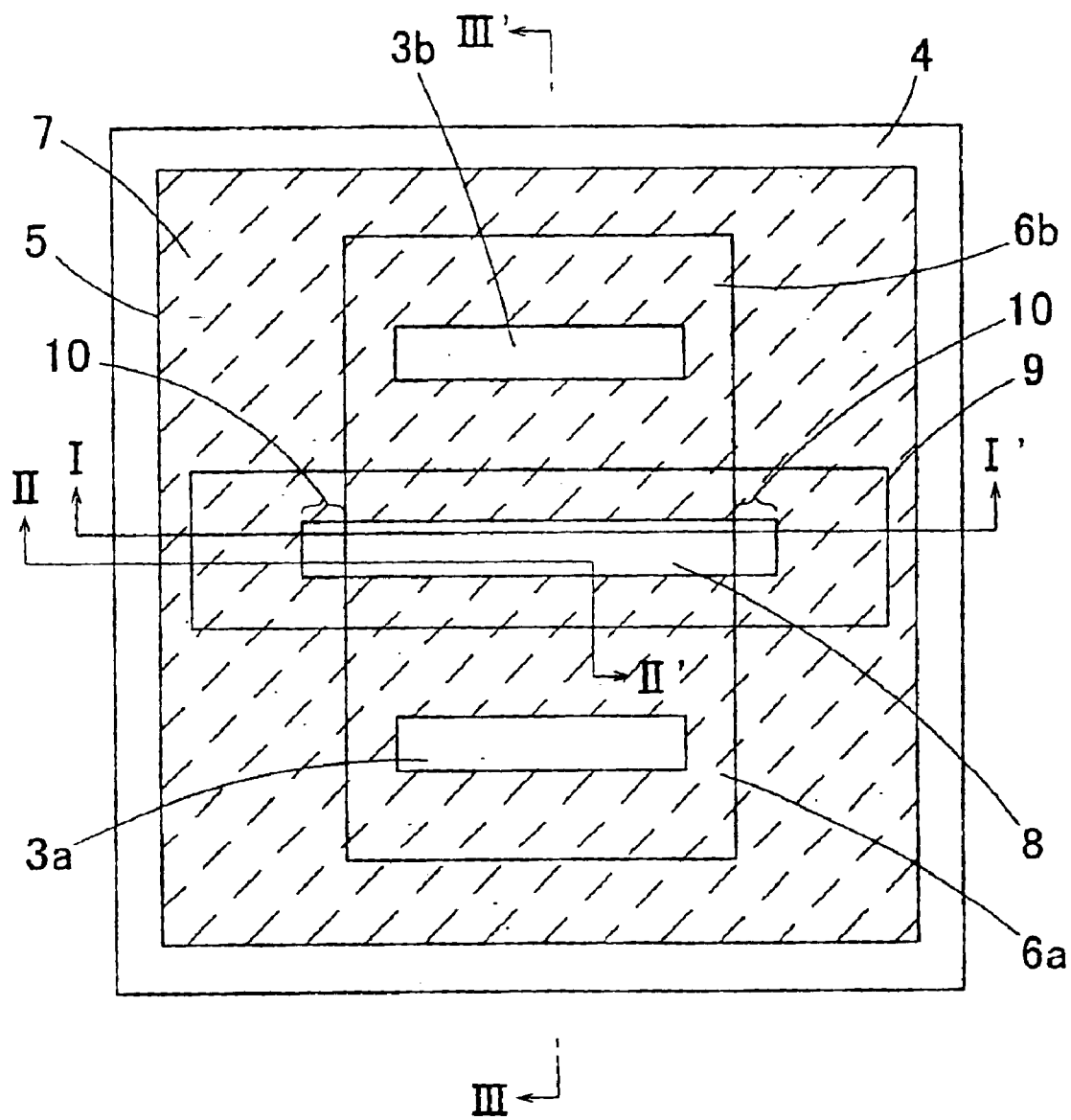
FIG. 3A is a perspective plan view of the conventional semiconductor device.
Figure 3B:
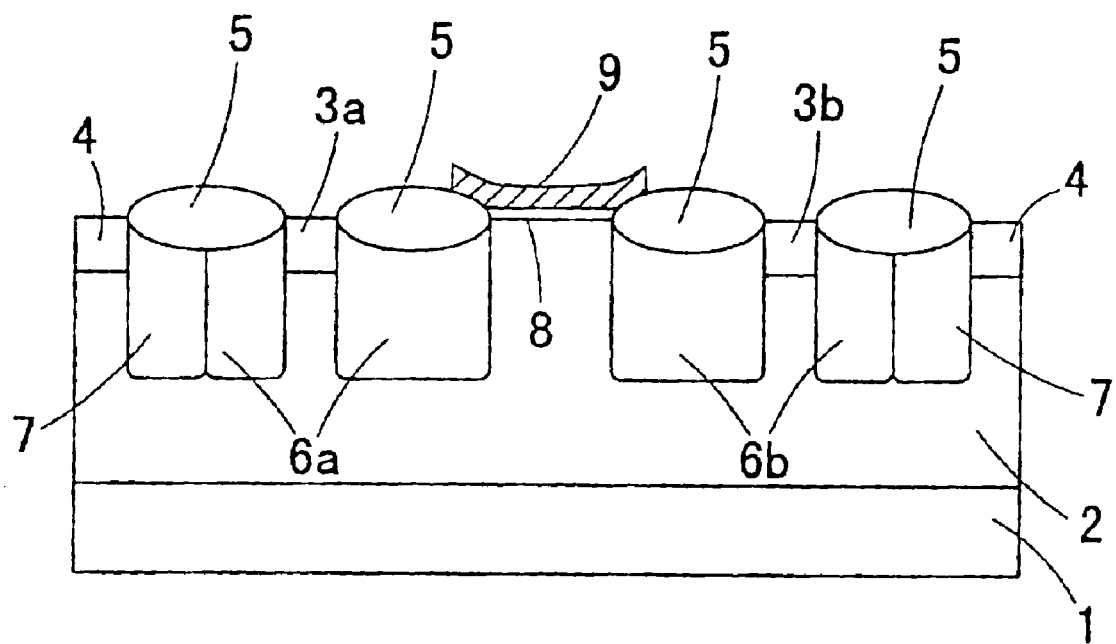
FIG. 3B is a cross-sectional view of the conventional semiconductor device taken on the line III–III'.
Figure 3C:
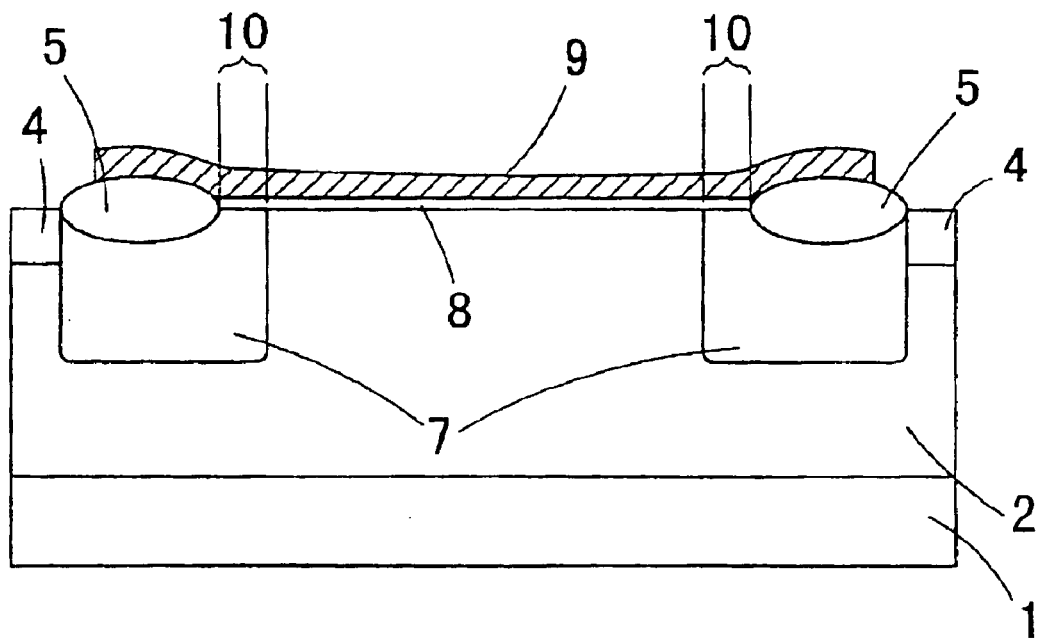
FIG. 3C is a cross-sectional view of the conventional semiconductor device taken on the line I–I'.
Figure 3D:
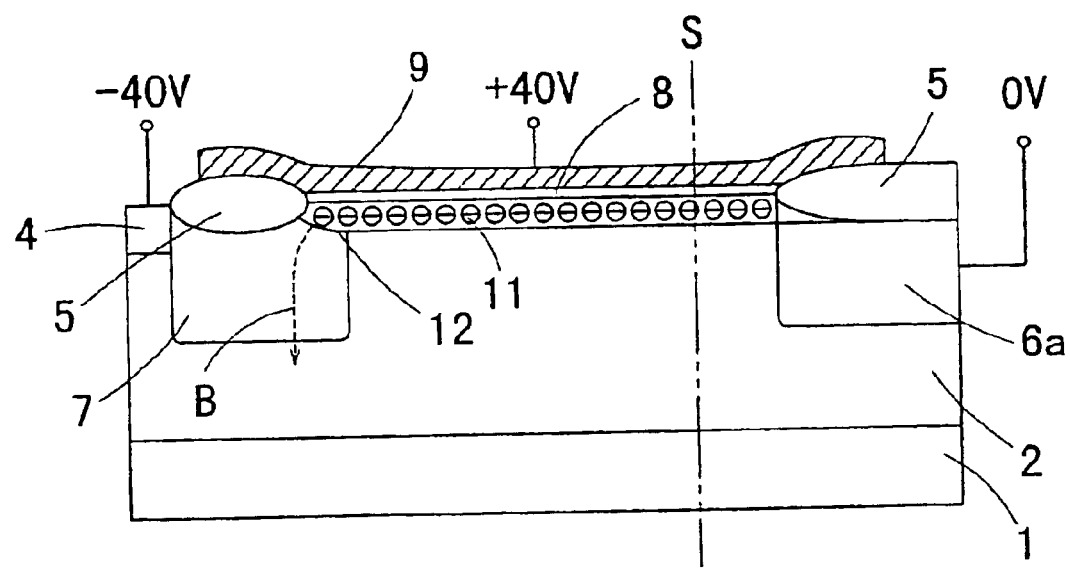
FIG. 3D is a cross-sectional view of the conventional semiconductor device taken on the line II–II'.

The structure of an N-channel high voltage transistor which is a semiconductor device according to a second embodiment of the present invention is shown in FIGS. 2A to 2C. FIG. 2A is a perspective plan view of the high voltage transistor according to the second embodiment. FIG. 2B is a cross-sectional view taken on the line I–I' of FIG. 2A. FIG. 2C is a cross-sectional view taken on the line II–II' of FIG. 2A. The chain double-dashed line S in FIG. 2C represents the bent part of the line II–II' of FIG. 2A.

In the second embodiment, like in the first embodiment, a P-type well 2 is present on the surface of a P-type substrate 1. N-type source and drain diffusion layers 3a and 3b, a P-type guard band diffusion layer 4 and a LOCOS oxide film 5 are present on the surface of the P-type well 2. N-type offset source and drain diffusion layers 6a and 6b and a P-type diffusion layer 7 are present below the LOCOS oxide film 5. A polysilicon gate electrode 9 is present so as to cover a gate oxide film 8 and part of the LOCOS oxide film 5.

Viewing this structure two-dimensionally with reference to FIG. 2A, the N-type offset diffusion layers 6a and 6b are present around the N-type source and drain diffusion layers 3a and 3b of a high impurity concentration, for example, in a range of 6 μm from ends of the diffusion layers 3a and 3b and is not present below the gate oxide film 8. The P-type diffusion layer 7 is present in contact with the N-type offset diffusion layers 6a and 6b. The gate oxide film 8 is formed between the source side N-type offset diffusion layer 6a and the drain side N-type offset diffusion layer 6b, and protruding parts 10 outwardly protruding, for example, by 4 μm from between the diffusion layers 6a and 6b are present. The P-type diffusion layer 7 is formed inside the P-type guard band diffusion layer 4, is in contact with the N-type offset diffusion layers 6a and 6b, and is formed outside the region where the gate oxide film 8 is present so as to be separated therefrom. Consequently, the P-type diffusion layer 7 is absent below the protruding parts 10 of the gate oxide film 8. This is apparent from the cross-sectional view of FIG. 2B.

This embodiment has a similar structure to the conventional example shown in FIGS. 3A to 3D except that the region where the P-type diffusion layer 7 is formed is partly different from that of the conventional example, and the LOCOS oxide film 5 is formed in the same region as that of the conventional example.

In such a transistor structure, even when a positive voltage as high as several tens of volts, for example, 40 V is applied to the gate electrode 9 and an N-type inversion layer 11 is formed below the gate oxide film 8 as shown in FIG. 2C, the P-type region existing around the N-type inversion layer 11 the voltage at which is substantially 0 V is only the P-type well 2 of a low concentration, and the P-type diffusion layer 7 to which –40 V is applied through the P-type guard band diffusion layer 4 is separated from the N-type inversion layer 11 and is never in contact therewith. Consequently, it is the P-type well 2 having a lower concentration than the P-type diffusion layer 7 that forms a PN junction 13 with the N-type inversion layer 11 (see the example of diffusion layer concentrations explained in the first embodiment), and the energy barrier of the PN junction 13 is higher than that of the PN junction of the N-type inversion layer 11 and the P-type diffusion layer 7. Consequently, no leakage current is caused even when a potential difference of approximately 40 V is caused between P and N, and it has experimentally been confirmed that no problem arises even when the potential difference is 60 V.

As described above, in the second embodiment, since the P-type diffusion layer 7 is separated from the gate oxide film 8 where the N-type inversion layer 11 is formed, the leakage current is smaller than that in the first embodiment in which they are in contact, so that a highly reliable high voltage transistor in which increase in power consumption is suppressed is realized.

While the first and the second embodiments are described by using as an example an N-channel transistor in which the region of the first conductivity type is the P-type well 2, the diffusion layer of the second conductivity type is the N-type offset diffusion layers 6a and 6b and the N-type source and drain diffusion layers 3a and 3b and the diffusion layer of the first conductivity type is the P-type diffusion layer 7, similar effects are obtained in a P-channel transistor in which the conductivity types are reversed, because PN junctions are formed similarly.

While the first and the second embodiments are described with high voltage transistors as examples, the present invention is applicable to MOS transistors of different types such as an SD (single drain) structure and an LDD (low density drain) structure.

What is claimed is:

1. A semiconductor device comprising:
   a source side offset diffusion layer region and a drain side offset diffusion layer region of a second conductivity type in a transistor formed, so as to be separated from each other, in a predetermined region in a region of a first conductivity type in a semiconductor substrate;
   a gate insulator film formed between said source side offset diffusion layer region and said drain side offset diffusion layer region;
   a gate electrode formed on said gate insulator film; and
   a diffusion layer of the first conductivity type of which an impurity concentration is higher than that of said region of the first conductivity type and which is formed so as to surround said source side offset diffusion layer region, said drain side offset diffusion layer region and said gate insulator film, wherein:
   both ends of said gate insulator film in a direction substantially perpendicular to a direction from said source side offset diffusion layer region to said drain side offset diffusion layer region form protruding portions that protrude at borders of said source side offset diffusion layer region and of said drain side offset diffusion layer region in a direction toward said diffusion layer of the first conductivity type,
   said gate insulator film at said protruding portions makes direct contact with said gate electrode,
   said diffusion layer of the first conductivity type is formed so as to surround said protruding portions, and
   a position of an end of said diffusion layer of the first conductivity type at each of parts surrounding said protruding portions substantially coincides with a position of an end of each of said protruding portions.

2. A semiconductor device according to claim 1 wherein said diffusion layer of the first conductivity type is a channel stopper region.

3. A semiconductor device according to claim 1, wherein said transistor is a high voltage transistor having a source diffusion layer within said source side offset diffusion layer region and a drain diffusion layer within said drain side offset diffusion layer region and said source side offset diffusion layer and said drain side offset diffusion layer have impurity concentrations lower than those of said source diffusion layer and said drain diffusion layer.

4. A semiconductor device according to claim 3 wherein said diffusion layer of the first conductivity type is a channel stopper region.

5. A semiconductor device comprising:
a source side offset diffusion layer region and a drain side offset diffusion layer region of a second conductivity type in a transistor formed, so as to be separated from each other, in a predetermined region in a region of a first conductivity type in a semiconductor substrate;
a gate insulator film formed between said source side offset diffusion layer region and said drain side offset diffusion layer region;
a gate electrode formed on said gate insulator film; and
a diffusion layer of the first conductivity type of which an impurity concentration is higher than that of said region of the first conductivity type and which is formed so as to surround said source side offset diffusion layer region, said drain side offset diffusion layer region and said gate insulator film, wherein:
both ends of said gate insulator film in a direction substantially perpendicular to a direction from said source side offset diffusion layer region to said drain offset diffusion layer region form protruding portions that protrude at borders of said source side offset diffusion layer region and of said drain side offset diffusion layer region in a direction toward said diffusion layer of the first conductivity type,
said gate insulator film at said protruding portions makes direct contact with said gate electrode, and
said diffusion layer of the first conductivity type is formed so as to surround said protruding portions and so as to be separated from the protruding portions by a predetermined distance.

6. A semiconductor device according to claim 5 wherein said diffusion layer of the first conductivity type is a channel stopper region.

7. A semiconductor device according to claim 5, wherein said transistor is a high voltage transistor having a source diffusion layer within said source side offset diffusion layer region and a drain diffusion layer within said drain side offset diffusion layer region and said source side offset diffusion layer and said drain side offset diffusion layer have impurity concentrations lower than those of said source diffusion layer and said drain diffusion layer.

8. A semiconductor device according to claim 7 wherein said diffusion layer of the first conductivity type is a channel stopper region.

* * * * *